United States Patent
Fujii et al.

(10) Patent No.: US 6,200,382 B1
(45) Date of Patent: *Mar. 13, 2001

(54) METHOD OF MANUFACTURING A SEMICONDUCTOR LASER DEVICE AND A CRYSTAL GROWTH APPARATUS FOR USE IN A SEMICONDUCTOR LASER DEVICE

(75) Inventors: Hiroaki Fujii; Kenji Endo, both of Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/352,775

(22) Filed: Jul. 14, 1999

(30) Foreign Application Priority Data

Jul. 14, 1998 (JP) .................................................. 10-199070

(51) Int. Cl.$^7$ ...................................................... C30B 33/06
(52) U.S. Cl. .................... 117/3; 117/2; 117/84; 117/104; 117/904
(58) Field of Search ................................... 117/3, 2, 904, 117/84, 104; 372/45, 46

(56) References Cited

U.S. PATENT DOCUMENTS

| | | |
|---|---|---|
| 4,691,321 * | 9/1987 | Motegi et al. .......................... 372/46 |
| 4,835,117 * | 5/1989 | Ohba et al. ........................... 437/129 |
| 4,987,097 * | 1/1991 | Nitta et al. ........................... 437/129 |
| 5,153,889 * | 10/1992 | Sugawara et al. ...................... 372/45 |
| 5,432,808 * | 7/1995 | Hatano et al. ......................... 372/45 |
| 5,621,748 * | 4/1997 | Kondo et al. .......................... 372/46 |
| 5,740,192 * | 4/1998 | Hatano et al. ......................... 372/45 |
| 5,874,747 * | 2/1999 | Redwing et al. ....................... 257/77 |

FOREIGN PATENT DOCUMENTS

| | | | |
|---|---|---|---|
| 62-200786 | 9/1987 | (JP) | .................................. H01S/3/18 |
| 2-58883 | 2/1990 | (JP) | .................................. H01S/3/18 |
| 8-32113 | 2/1996 | (JP) | ................................. H01L/33/00 |

* cited by examiner

*Primary Examiner*—Benjamin L. Utech
*Assistant Examiner*—Matthew Anderson
(74) *Attorney, Agent, or Firm*—Sughrue, Mion, Zinn, Macpeak & Seas, PLLC

(57) ABSTRACT

In a method of manufacturing a semiconductor laser device having a double hetero structure which is structured by at least a first clad layer, an active layer and a second clad layer on a semiconductor substrate by the use of the organic metal vapor growth method, crystal is grown in first atmosphere gas containing hydrogen in a temperature rising process. Subsequently, the first atmosphere gas is switched into second atmosphere gas in a temperature dropping process after the crystal growth. The second atmosphere gas contains no hydrogen.

8 Claims, 3 Drawing Sheets

2

METHOD OF MANUFACTURING A SEMICONDUCTOR LASER DEVICE AND A CRYSTAL GROWTH APPARATUS FOR USE IN A SEMICONDUCTOR LASER DEVICE

BACKGROUND OF THE INVENTION

This invention relates to a semiconductor laser, and in particular, to an AlGaInP based visible light semiconductor laser which is used as a light source for an optical disk, such as, a digital versatile disk (DVD) and a magneto-optical (MO) disk.

A ridge waveguide type laser illustrated in FIG. 1 is generally used in the conventional AlGaInP based visible semiconductor laser. The laser having such a structure is fabricated by performing the known MOVPE (Metalorganic Vapor Phase Epitaxy) method three times. For example, this method is disclosed in Japanese Unexamined Patent Publications No. Hei. 2-58883 and No. Sho. 62-200786.

A double hetero structure having an active layer is formed in a first crystal growth. Subsequently, the ridge structure of a mesa-stripe shape is formed by etching with a dielectric mask.

In a second crystal growth, a GaAs current block layer is formed on a clad layer outside the mesa-stripe by the use of the selective growth method using the same dielectric mask.

Finally, in a third crystal growth, a p-GaAs contact layer is formed on an entire surface, and the laser structure is formed after forming an electrode.

As illustrated in FIG. 1, the semiconductor laser has a n-GaAs buffer layer 170, a n-AlGaInP clad layer 130, a MQW active layer 110, a p-AlGaInP clad layer 120, a p-GaInP etching stopper layer 140, a n-GaAs block layer 180, a p-AlGaInP clad layer 150, a p-GaInP hetero buffer layer 160, a-pGaAs cap layer 190, a p-GaAs contact layer 195 on a n-GaAs substrate 200. Further, electrodes 210 and 220 are arranged at upper and lower sides of the semiconductor laser.

Referring to FIG. 2, description will be made about the conventional crystal growth apparatus for manufacturing such a semiconductor laser device by the use of the MOVPE method.

A susceptor 320, which mounts a GaAs substrate 330, is contained in a reactive tube 310. Further, a V-group raw material gas inlet 340, a hydrogen gas inlet 360 and a III-group three gas inlet 370 are arranged in the reactive tube 310.

In this event, organic metal (TMAl, TEGa, TMIn) is supplied as the III-group raw material of the semiconductor laser while hydrogenated V-group gas (PH$_3$, AsH$_3$) is supplied as the V-group raw material. Herein, hydrogen is supplied to the reactive tube 310 as a carrier gas.

In this case, attention is paid for atmosphere gas and growth temperature in a temperature dropping process after each crystal growth.

As illustrated in FIG. 3, mixed atmosphere between hydrogenated V-group gas, which is used for the growth of the final growth layer, and hydrogen gas as the carrier gas is generally used as the atmosphere gas. Herein, AsH$_3$ gas is, for example, used as the hydrogenated V-group gas when the GaAs is the final layer.

However, the mixed atmosphere is decomposed during the temperature dropping process. Consequently, much active hydrogen exists in the atmosphere.

On the other hand, p-type impurities are inactivated by combining with hydrogen molecules in the crystal growth of the p-type semiconductor crystal of the AlGaInP based compound semiconductor. In consequence, p-carrier concentration is lowered.

The hydrogen is supplied from the atmosphere gas into the semiconductor crystal during the crystal growth and the temperature dropping process in the conventional method. Thereby, the crystal growth is completed on the condition that much hydrogen is left in the p-type semiconductor crystal (p-type impurity passivation region 260).

As a result, carrier-over increase, which causes reduction of the p-carrier concentration, occurs in the semiconductor laser manufactured by the conventional method. Consequently, deterioration of high temperature operation characteristic becomes remarkable.

Further, hydrogen, which is trapped into the crystal, is readily changed in the state with time. In consequence, it is difficult to realize stable laser characteristic.

Meanwhile, disclosure has been made about the atmosphere gas during the growth of the semiconductor in Japanese Unexamined Patent Publication No. Hei.8-32113 (hereinafter, referred to as a first reference). The first reference discloses a method of manufacturing a p-type GaN based semiconductor device.

More specifically, description has been made at page 1, ninth paragraph in the first reference about a technique featured by cooling at slower speed than natural cooling, preferably under an inactive gas atmosphere after a GaN based semiconductor, which is doped with a p-type impurity, is grown.

However, no description has been made about manufacture of the semiconductor laser in the first reference. Further, the first reference is limited to the GaN based semiconductor. Therefore, the first reference can not be applied for the semiconductor laser, such as, the AlGaInP based semiconductor laser.

SUMMARY OF THE INVENTION

It is therefore an object of this invention to provide a method of manufacturing a semiconductor laser which is capable of avoiding passivation of a p-type semiconductor crystal caused by hydrogen trapped during crystal growth and which has excellent high temperature operation characteristic and stable operation characteristic with time.

According to this invention, a semiconductor laser device has a double hetero structure which is structured by at least a first clad layer, an active layer and a second clad layer on a semiconductor substrate by the use of the organic metal vapor growth method.

With such a structure, crystal is grown in first atmosphere gas containing hydrogen in a temperature rising process.

Subsequently, the first atmosphere gas is switched into second atmosphere gas in a temperature dropping process after the crystal growth. In this event, the second atmosphere gas contains no hydrogen.

In this case, the grown crystal is retained at a predetermined temperature during a preselected duration in the temperature dropping process after switching into the second gas atmosphere.

The predetermined temperature and the preselected duration are selected so that the hydrogen is removed from the grown crystal.

For example, the grown crystal is a p-type semiconductor having p-type impurity, and passivation of the p-type impurity due to the hydrogen is prevented by removing the hydrogen from the grown crystal.

Preferably, the predetermined temperature is 450° C. or more, and the preselected duration is one minute or more.

The second atmosphere gas is at least one selected from group consisting of nitrogen gas, argon gas and helium gas.

Further, the double hetero structure is formed using organic metal as III-group gas, hydrogenated V-group gas as V-group gas and the hydrogen as carrier gas in the organic metal vapor growth method.

In this event, the organic metal is at least one selected from the group consisting of TMAl, TEGa, and TMIn while the hydrogenation V-group gas is either one of $PH_3$ and $AsH_3$.

For example, each of the first and second clad layers comprises either one of AlGaInP and AlInP while the active layer comprises either one of GaInP and AlGaInP.

More specifically, the atmosphere gas is changed from the hydrogen gas+hydrogenation V-group gas into the gas containing no hydrogen, such as, the nitrogen gas in the dropping temperature process in the method of manufacturing the semiconductor laser according to this invention.

Thereby, the trap of the hydrogen into the p-type semiconductor crystal can be effectively prevented. Further, the elimination of the hydrogen, which has been trapped, from the semiconductor can be enhanced.

Consequently, the high p-carrier concentration can be realized. As a result, both the excellent high temperature operation characteristic and the stable laser characteristic with time can be realized.

DESCRIPTION OF THE PREFERRED EMBODIMENT

Figure 1:
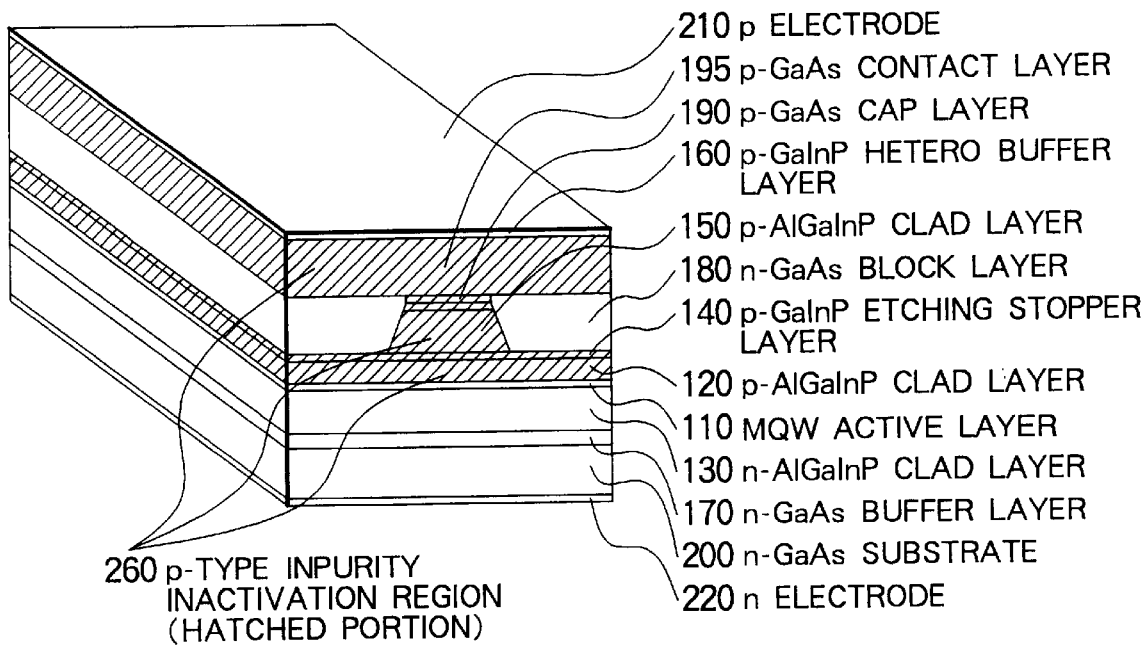
FIG. 1 is a structure diagram showing an AlGaInP visible light semiconductor laser which is manufactured by the use of the conventional method of manufacturing a semiconductor laser.
Figure 2:
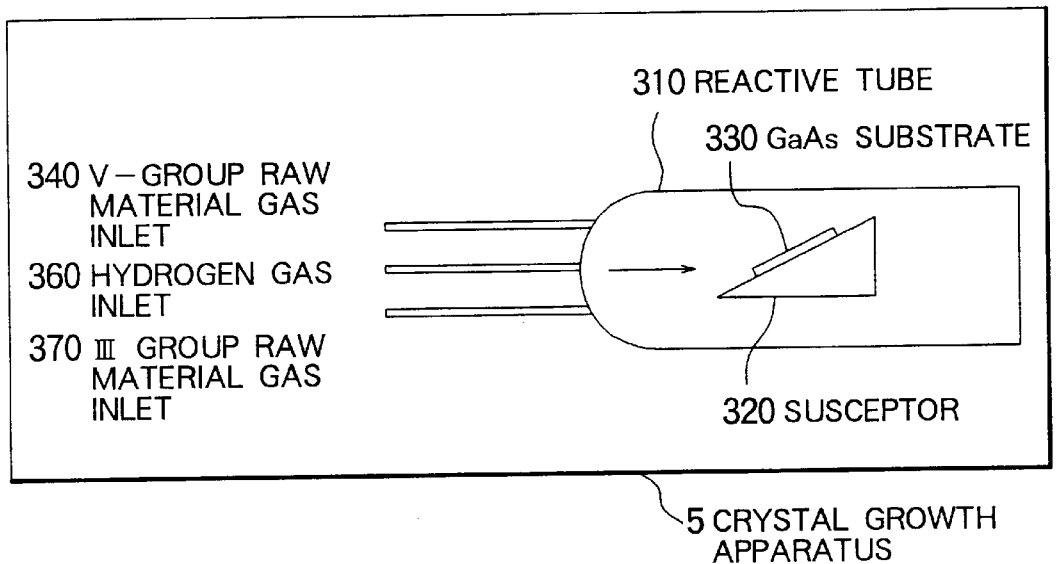
FIG. 2 is a schematic diagram showing the conventional crystal growth apparatus.
Figure 3:
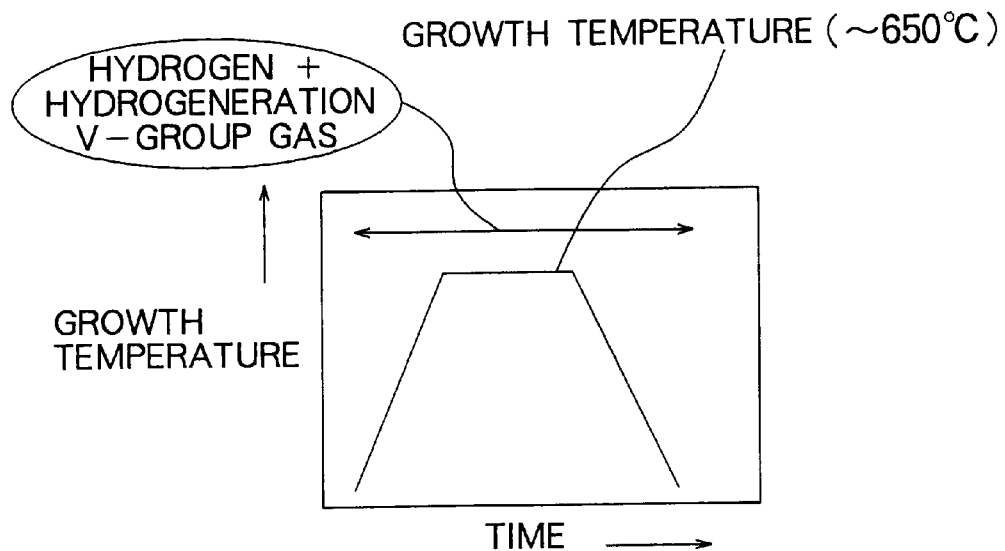
FIG. 3 is a diagram for showing a temperature profile in the conventional manufacturing method.
Figure 4:
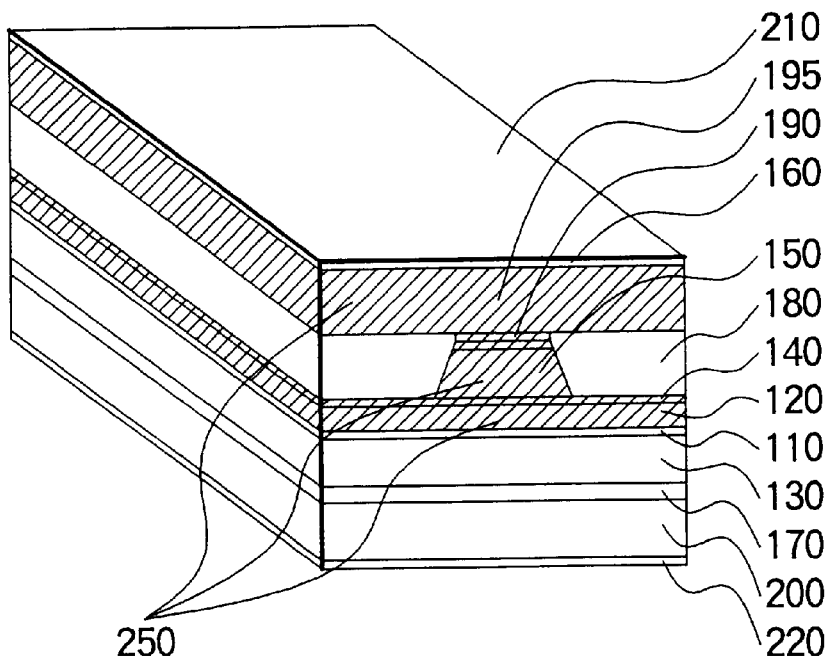
FIG. 4 is a structure diagram showing an AlGaInP visible light semiconductor laser which is manufactured by the use of a method of manufacturing a semiconductor laser according to this invention.

Referring to drawings, description will be made about a method of manufacturing a semiconductor laser according to an embodiment of this invention. Herein, the semiconductor laser illustrated in FIG. 4 is manufactured by performing the MOVPE crystal growth three times in the same manner as the semiconductor laser explained in the conventional case.

Figure 5:
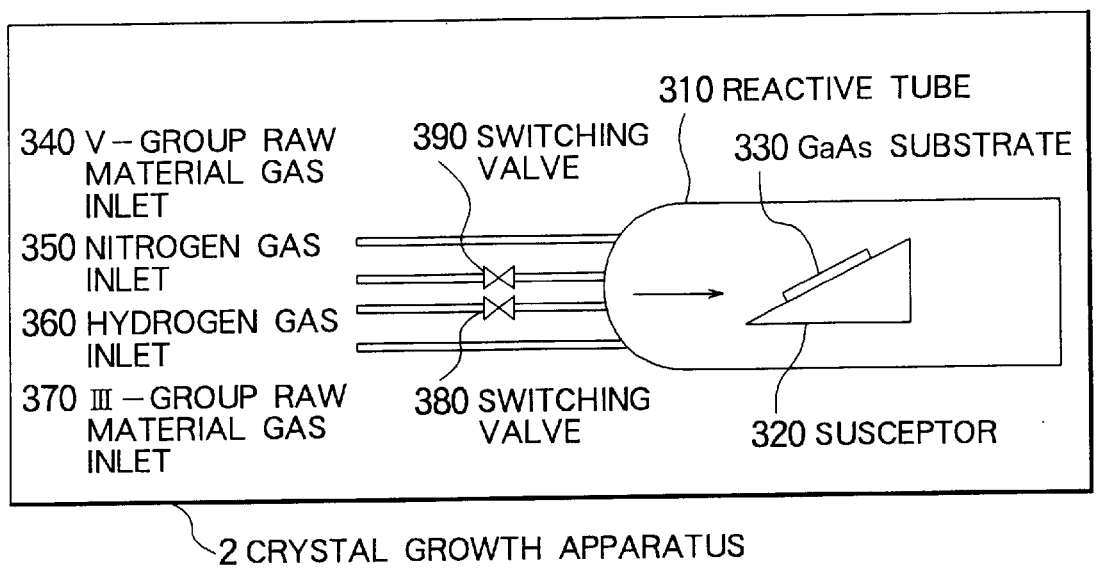
FIG. 5 is a schematic diagram showing a crystal growth apparatus according to this invention.

A crystal growth apparatus 2 illustrated in FIG. 5 is used in manufacturing a semiconductor laser of this invention. The crystal growth apparatus 2 is different from the crystal growth apparatus 5 used in the conventional manufacturing method in that a nitrogen gas inlet 350 is provided and switching valves 380 and 390 are arranged for the nitrogen gas inlet 350 and a hydrogen gas inlet 360.

In a first crystal growth, a double hetero structure having an MQW (Multi Quantum Well) active layer 110 is formed (n-GaAs buffer layer 170~a p-GaAs cap layer 190).

In this event, organic metal (TMAl, TEGa, TMIn) is used for III-group group as raw material while hydrogenated V-group gas ($PH_3$, $AsH_3$) is used for the V-group as raw material. In this event, hydrogen is used as a carrier gas. Herein, it is to be noted that the crystal growth is carried out at 650° C. or less.

Figure 6:
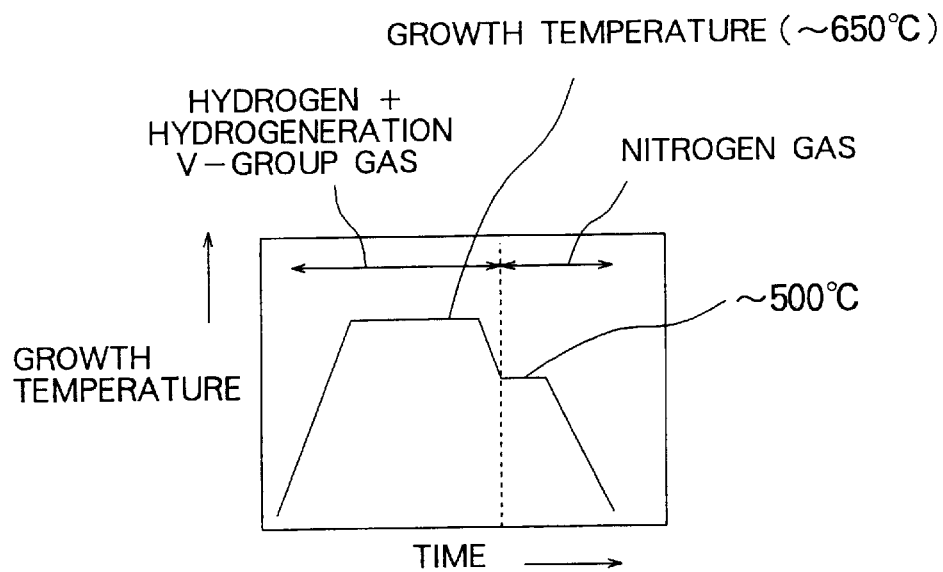
FIG. 6 is a diagram for showing a temperature profile in a manufacturing method according to this invention.

Further, rising temperature and crystal growth is carried out in accordance with temperature profile illustrated in FIG. 6, and dropping temperature is started in accordance with the same profile. In this case, atmosphere gas in the reactive tube when the dropping temperature is started becomes mixed atmosphere of the hydrogen gas as the carrier gas and the $AsH_3$ gas used for the p-GaAs of the final growth layer.

After the dropping temperature step is performed up to 500° C., the atmosphere gas of the hydrogen gas+$AsH_3$ is changed into gas containing no hydrogen, such as, the nitrogen gas, and this state is maintained for 5 minutes at 500° C.

Thereby, quantity of the hydrogen, which is supplied from the atmosphere gas into crystal, is largely reduced. Further, elimination of the hydrogen, which has been trapped into the crystal, is enhanced or fostered.

As a result, passivation due to the hydrogen of the p-type impurity, which causes the conventional problem and reduction of the carrier concentration caused thereby, can be largely improved.

In this event, the temperature for switching the gases should be high enough so that the hydrogen trapped in the crystal is removed; for example, 450° C. or more. Further, the waiting time should be long enough so that the hydrogen is removed; for example, 1 minute or more.

Alternatively, the other gases containing no hydrogen may be used as the gas after the switching. For example, argon gas and helium gas may be used instead of the nitrogen gas.

Subsequently, a ridge structure having a mesa-stripe shape is formed by the use of the dielectric mask. Thereafter, a GaAs current block layer 180 is formed on a clad layer outside the mesa-stripe by the use of the selective growth method (twice crystal growth) using the same dielectric mask.

Finally, the dielectric mask is removed, and a p-GaAs contact layer 195 is formed on an entire surface by third times crystal growth. After electrodes 210 and 220 are formed, the laser structure is completed.

In this case, the hydrogen gas+hydrogenated V-group gas is changed into the nitrogen gas in the dropping temperature process in the same manner as the first crystal growth in the dropping temperature step after crystal growth of twice and third times. In this event, a constant time (5 minutes or less) is waited at enough temperature (500° C. or less) such that the hydrogen is removed from the crystal.

The passivation due to the hydrogen of the p-type impurity, which causes the conventional problem and the reduction of the p-type carrier concentration caused thereby, can be avoided (the p-type impurity activation region 250) in the AlGaInP visible light semiconductor laser manufactured via the above-mentioned steps.

As a result, the semiconductor laser, which has small carrier over-flow and excellent high temperature operation characteristic, can be realized. Further, the quantity of the hydrogen, which is trapped into the crystal, can be largely reduced. Thereby, the stable laser characteristic, which has small effect with respect to the change of the hydrogen state with time, can be realized.

EXAMPLE

Hereinafter, description will be made about a method of manufacturing a semiconductor laser of this invention with specific values with reference to FIGS. 4 through 6.

In the first MOVPE, the n-GaAs buffer layer 170 having the thickness of 0.3 μm, the n-AlGaInP clad layer 130 having the thickness of 1.2 μm, a multi-quantum well (MQW) active layer 110 (for example, which is composed of a GaInP well having the thickness of 8 nm and an AlGaInP barrier having thickness of 4 nm), the p-AlGaInP clad layer 120 having the thickness of 0.25 μm, the p-GaInP etching stopper layer 140 having the thickness of 5 nm, the p-AlGaInP clad layer 150 having the thickness of 0.95 μm, the p-GaInP hetero buffer layer 160 having the thickness of 10 nm, and the p-GaAs cap layer 190 having the thickness of 0.3 μm are stacked in this sequence on the n-GaAs substrate 200 of (115) A orientation (15.8 degree off from (001) to [110] orientation).

In this event, organic metal (TMAl, TEGa, TMIn) is used for III-group as raw material while hydrogenated V-group gas ($PH_3$, $AsH_3$) is used for the V-group as raw material. In this event, hydrogen is used as a carrier gas. Herein, it is to be noted that the crystal growth is carried out at 650° C. or less.

Further, rising temperature and crystal growth is carried out in accordance with temperature profile illustrated in FIG. 6, and dropping temperature is started in accordance with the same profile.

In this case, atmosphere gas in the reactive tube when the dropping temperature is started becomes mixed atmosphere of the hydrogen gas as the carrier gas and the $AsH_3$ gas used for the p-GaAs cap layer 190 of the final growth layer.

After the dropping temperature step is performed up to 500° C., the atmosphere gas of the hydrogen gas+$AsH_3$ is changed into gas containing no hydrogen, such as, the nitrogen gas, and this state is waited for 5 minutes at 500° C.

The switching valves 380 and 390 illustrated in FIG. 5 are newly arranged to smoothly perform the switching from the hydrogen gas into the nitrogen gas. With such a structure, the switching is carried out by opening and closing the both valves at the same time.

Thereby, the quantity of the hydrogen, which is supplied from the atmosphere gas into crystal (particularly, the p-type semiconductor crystal), is largely reduced. Further, elimination of the hydrogen, which has been trapped into the crystal, is enhanced or fostered.

In the conventional case, the hydrogen having the concentration enough to lower the p-carrier concentration (for example, the concentration of about $8 \times 10^{17}$ $cm^{-3}$) is left in the crystal. On the other hand, the remained hydrogen concentration becomes $1 \times 10^{17}$ $cm^{-3}$ or less in this invention, and can be reduced to the level in which almost does not cause the problem.

As a result, reduction of the carrier concentration due to passivation of the p-type impurity, which causes the conventional problem, can be largely improved.

In this event, the temperature for switching the gases should be high enough so that the hydrogen trapped in the crystal is removed; for example, 450° C. or more. Further, the duration should be long enough duration so that the hydrogen is removed; for example, 1 minute or more.

Alternatively, the other gases containing no hydrogen may be used as the gas after the switching. For example, argon gas and helium gas may be used instead of the nitrogen gas.

Subsequently, the ridge structure having the mesa-stripe shape is formed by the use of the dielectric mask. Thereafter, the GaAs current block layer 180 is formed on the clad layer outside the mesa-stripe by the use of the selective growth method (twice crystal growth) using the same dielectric mask.

Finally, the dielectric mask is removed, and the p-GaAs contact layer 195 having a thickness of 3.0 μm is formed on the entire surface by third times crystal growth. After the electrodes 210 and 220 are formed, the laser structure is completed.

In this case, the hydrogen gas+hydrogenated V-group gas is changed into the nitrogen gas in the dropping temperature process in the same manner as the first crystal growth in the dropping temperature step after crystal growth of twice and third times. In this event, a constant time (5 minutes or less) is waited at enough temperature (500° C. or less) such that the hydrogen is removed from the crystal.

The passivation due to the hydrogen of the p-type impurity, which causes the conventional problem and the reduction of the p-type carrier concentration caused thereby, can be avoided in the AlGaInP visible light semiconductor laser manufactured via the above-mentioned steps.

As a result, the semiconductor laser, which has small carrier over-flow and excellent high temperature operation characteristic, can be realized. Specifically, the visible light laser, which can be operated in high temperature of 110° C. or more in oscillation wave length of 650 nm, can be obtained.

Further, the quantity of the hydrogen, which is trapped into the crystal, can be largely reduced. Thereby, the stable laser characteristic, which has small effect with respect to the change of the hydrogen state with time, can be realized. Specifically, high reliability can be obtained so that the laser has small initial variation of the laser characteristic and is sufficiently practical for about 10,000 hours.

As mentioned before, description has been made about the method of manufacturing the semiconductor laser according to this invention with the example of the AlGaInP based semiconductor crystal.

However, the problem of the passivation due to the hydrogen of the p-type impurity is common to the other compound semiconductor devices. Therefore, this invention can be applied for semiconductor devices, such as, an AlGaAs based semiconductor device, an InGaAsP based semiconductor device, a GaAsSb based semiconductor device, and an AlGaInN based semiconductor device in the art.

What is claimed is:

1. A method of manufacturing a semiconductor laser device having a double hetero structure which is structured by at least a first clad layer, an active layer and a second clad layer on a semiconductor substrate by the use of the organic metal vapor growth method, comprising the steps of:

growing a crystal in a first atmosphere gas containing hydrogen in a temperature rising process, switching the first atmosphere gas into a second atmosphere gas containing no hydrogen in a temperature dropping process after the crystal growth, and retaining the semiconductor substrate at a constant temperature of from 450° C. to 500° C. for a fixed period of time in the temperature dropping process.

2. A method as claimed in claim 1, wherein:

the fixed period of time is selected so that the hydrogen is removed from the grown crystal.

3. A method as claimed in claim 2, wherein:

the grown crystal is a p-type semiconductor having p-type impurity, and passivation of the p-type impurity due to the hydrogen is prevented by removing the hydrogen from the grown crystal.

4. A method as claimed in claim 2, wherein:

the fixed period of time is from one minute to five minutes.

5. A method as claimed in claim 1, wherein:

the second atmosphere gas is at least one selected from group consisting of nitrogen gas, argon gas and helium gas.

6. A method as claimed in claim 1, wherein:

the double hetero structure is formed using organic metal as III-group gas, hydrogenated V-group gas as V-group gas and the hydrogen as carrier gas in the organic metal vapor growth method.

7. A method as claimed in claim 6, wherein:

the organic metal is at least one selected from the group consisting of TMAl, TEGa, and TMIn while the hydrogenated V-group gas is either one of $PH_3$ and $AsH_3$.

8. A method as claimed in claim 1, wherein:

each of the first and second clad layers comprises either one of AlGaInP and AlInP while the active layer comprises either one of GaInP and AlGaInP.

* * * * *